United States Patent
Da Costa Ribeiro De Miranda et al.

(10) Patent No.: US 12,007,274 B2
(45) Date of Patent: Jun. 11, 2024

(54) DEVICE AND METHOD FOR ULTRASHORT PULSE TEMPORAL MEASUREMENT

(71) Applicant: SPHERE ULTRAFAST PHOTONICS SA, Oporto (PT)

(72) Inventors: Miguel Nicolau Da Costa Ribeiro De Miranda, Lund (SE); Chen Guo, Lund (SE); Maïté Louisy, Lund (SE); Cord Louis Arnold, Lund (SE); Anne Genevieve L'Huillier Wahlstrom, Lund (SE)

(73) Assignee: SPHERE ULTRAFAST PHOTONICS SA, Oporto (PT)

( * ) Notice: Subject to any disclaimer, the term of this patent is extended or adjusted under 35 U.S.C. 154(b) by 483 days.

(21) Appl. No.: 17/292,659

(22) PCT Filed: Nov. 8, 2018

(86) PCT No.: PCT/IB2018/058792
§ 371 (c)(1),
(2) Date: May 10, 2021

(87) PCT Pub. No.: WO2020/095095
PCT Pub. Date: May 14, 2020

(65) Prior Publication Data
US 2022/0011166 A1   Jan. 13, 2022

(51) Int. Cl.
*G01J 11/00* (2006.01)
*G01R 29/08* (2006.01)

(52) U.S. Cl.
CPC .............. *G01J 11/00* (2013.01); *G01R 29/08* (2013.01)

(58) Field of Classification Search
CPC ................................. G01J 11/00; G01R 29/08
See application file for complete search history.

(56) References Cited

U.S. PATENT DOCUMENTS

2003/0025911 A1   2/2003  Walmsley et al.
2014/0321486 A1*  10/2014 Da Costa Ribeiro De Miranda ... H01S 3/0057
                                                                    372/21

(Continued)

FOREIGN PATENT DOCUMENTS

EP      3062075 A1 *  8/2016  .............. G01J 11/00
WO   WO 2013054292 A1   4/2013
WO   WO 2018029615 A1   2/2018

OTHER PUBLICATIONS

D. J. Kane and R. Trebino, "Characterization of Arbitrary Femtosecond Pulses Using Frequency-Resolved Optical Gating," IEEE J. Quantum Electron. 29, 571 (1993).

(Continued)

*Primary Examiner* — Tarifur R Chowdhury
*Assistant Examiner* — Carlos Perez-Guzman
(74) *Attorney, Agent, or Firm* — Leason Ellis LLP

(57) ABSTRACT

The present disclosure relates to laser systems and laser pulse measurement methods. The method comprises a dispersive system for applying a controlled chirp, to an incoming ultrashort light pulse to be measured; an optical system for selecting an homogeneous part of the transverse spatial beam profile of said light pulse; applying different spectral phases to different spatial parts of the beam obtained in the previous step, which comprises allowing different spatial parts of the beam to cross different thicknesses of material; focusing or propagating the beam in a nonlinear medium after applying the spectral phases; applying a nonlinear process to the pulse to be characterized for each spatial part of the beam, allowing the generation of a nonlinear signal for each spatial part of the beam; measuring the corresponding bi-dimensional data set that has the information on the nonlinear signal generated for each applied spectral phase in a detector; applying a numerical iterative algorithm to the (Continued)

measured data set to retrieve the spectral phase of the pulse to be characterized; such process being done in a parallel fashion.

15 Claims, 2 Drawing Sheets

(56) References Cited

U.S. PATENT DOCUMENTS

2015/0357784 A1 12/2015 Mironov et al.
2017/0205292 A1 7/2017 Quere et al.
2018/0034227 A1 2/2018 Trull-Silvestre et al.

OTHER PUBLICATIONS

C. Iaconis and I. A. Walmsley, "Spectral phase interferometry for direct electric field reconstruction of ultrashort optical pulses," Opt. Lett. 23, 792 (1998).
R. Trebino and D. J. Kane, "Using phase retrieval to measure the intensity and phase of ultrashort pulses: frequency-resolved optical gating," J. Opt. Soc. Am. A 10, 1101 (1993).
R. Trebino, K. W. DeLong, D. N. Fittinghoff, J. Sweetser, M. A. Krum-bügel, and B. Richman, "Measuring ultrashort laser pulses in the time-frequency domain using frequency-resolved optical gating," Rev. Sci. Instrum. 68, 1 (1997).
S. Wyatt, I. A. Walmsley, G. Stibenz, and G. Steinmeyer, "Sub-10 fs pulse characterization using spatially encoded arrangement for spectral phase14 interferometry for direct electric field reconstruction," Opt. Lett. 31, 1914-1916 (2006).
T. Witting, F. Frank, W. Okell, C. Arrell, J. Marangos, and J. Tisch, "Sub-4-fs laser pulse characterization by spatially resolved spectral shearing interferometry and attosecond streaking," Journal of Physics B: Atomic, Molecular and Optical Physics 45, 074014 (2012).
J. R. Birge, H. M. Crespo, and F. X. Kärtner, "Theory and design of twodimensional spectral shearing interferometry for few-cycle pulse measurement," J. Opt. Soc. Am. B 27, 1165-1173 (2010).
M. Miranda, T. Fordell, C. Arnold, A. L'Huillier, and H. Crespo, "Simultaneous compression and characterization of ultrashort laser pulses using chirped mirrors and glass wedges," Opt. Express 20, 688-697 (2012).
M. Miranda, C. L. Arnold, T. Fordell, F. Silva, B. Alonso, R. Weigand, A. L'Huillier, and H. Crespo, "Characterization of broadband few-cycle laser pulses with the d-scan technique," Opt. Express 20, 18732-18743 (2012).
Daniel J. Kane and Rick Trebino, "Single-shot measurement of the intensity and phase of an arbitrary ultrashort pulse by using frequency-resolved optical gating," Opt. Lett. 18, 823-825 (1993).
Selcuk Akturk, Ciro D'Amico, and Andre Mysyrowicz, "Measuring ultrashort pulses in the single-cycle regime using frequency-resolved optical gating," J. Opt. Soc. Am. B 25, A63-A69 (2008).
D. Fabris, W. Holgado, F. Silva, T. Witting, J. W. G. Tisch, and H. Crespo, "Singleshot implementation of dispersion-scan for the characterization of ultrashort laser pulses," Opt. Express 23, 32803-32808 (2015).

J. A. Armstrong, "Measurement of picosecond laser pulse widths", Appl. Phys. Lett. 10 (1), 16 (1967).
K. Naganuma, K. Mogi and H. Yamada, "General method for ultrashort light pulse chirp measurement," in IEEE Journal of Quantum Electronics 25, 1225-1233 (1989). doi: 10.1109/3.29252.
Baltuska, Z. Wei, M. S. Pshenichnikov, D. A. Wiersma, and R. Szipocs, "All-solidstate cavity-dumped sub-5-fs laser," Appl. Phys. B 65, 175-188 (1997).
J. W. Nicholson, J. Jasapara, W. Rudolph, F. G. Omenetto, and A. J. Taylor, "Fullfield characterization of femtosecond pulses by spectrum and cross-correlation measurements," Opt. Lett. 24, 1774-1776 (1999).
V. V. Lozovoy, I. Pastirk, and M. Dantus, "Multiphoton intrapulse interference. IV. Ultrashort laser pulse spectral phase characterization and compensation," Opt. Lett. 29, 775-777 (2004).
B. Xu, J. M. Gunn, J. M. D. Cruz, V. V. Lozovoy, and M. Dantus, "Quantitative investigation of the multiphoton intrapulse interference phase scan method for simultaneous phase measurement and compensation of femtosecond laser pulses," J. Opt. Soc. Am. B 23, 750-759 (2006).
Y. Coello, V. V. Lozovoy, T. C. Gunaratne, B. Xu, I. Borukhovich, C.-H. Tseng, T. Weinacht, and M. Dantus, "Interference without an interferometer: a different approach to measuring, compressing, and shaping ultrashort laser pulses," J. Opt. Soc. Am. B 25, A140-A150 (2008).
T. Oksenhendler, S. Coudreau, N. Forget, V. Crozatier, S. Grabielle, R. Herzog, O. Gobert, and D. Kaplan, "Self-referenced spectral interferometry," Appl. Phys. B 99, 7-12 (2010).
Trabattoni, T. Oksenhendler, H. Jousselin, G. Tempea, S. D. Silvestri, G. Sansone, F. Calegari, and M. Nisoli, "Self-referenced spectral interferometry for single-shot measurement of sub-5-fs pulses," Rev. Sci. Instrum. 86, 113106 (2015).
F. Silva, M. Miranda, B. Alonso, J. Rauschenberger, V. Pervak, and H. Crespo, "Simultaneous compression, characterization and phase stabilization of GWlevel 1.4 cycle VIS-NIR femtosecond pulses using a single dispersion-scan setup," Opt. Express 22, 10181-10191 (2014).
H. Kogelnik, E. Ippen, A. Dienes and C. Shank, "Astigmatically compensated cavities for CW dye lasers," IEEE J. Quantum Electron. 8, 373-379 (1972). doi: 10.1109/JQE.1972.1076964.
B. Bates, M. McDowell, and A. C. Newton, "Correction of astigmatism in a Czerny-Turner spectrograph using a plane grating in divergent illumination," J. Ph. E 3, 206 (1970).
D. R. Austin, T. Witting, and I. A. Walmsley, "Broadband astigmatism-free Czerny-Turner imaging spectrometer using spherical mirrors," Appl. Opt. 48, 3846-3853 (2009).
Y. An, Q. Sun, Y. Liu, C. Li, and Z.-Q. Wang, "The design of astigmatism-free crossed Czerny-Turner spectrometer," Optik 124, 2539-2543 (2013).
M. Louisy, C. L. Arnold, M. Miranda, E. W. Larsen, S. N. Bengtsson, D. Kroon, M. Kotur, D. Guenot, L. Rading, P. Rudawski, F. Brizuela, F. Campi, B. Kim, A. Jarnac, A. Houard, J. Mauritsson, P. Johnsson, A. L'Huillier, and C. M. Heyl, "Gating attosecond pulses in a noncollinear geometry," Optica 2, 563-566 (2015).
M. Miranda, J. Penedones, C. Guo, A. Harth, M. Louisy, L. Neoricic, A. L'Huillier, and C. L. Arnold, "Fast iterative retrieval algorithm for ultrashort pulse characterization using dispersion scans," J. Opt. Soc. Am. B 34, 190-197 (2017).

* cited by examiner

DEVICE AND METHOD FOR ULTRASHORT PULSE TEMPORAL MEASUREMENT

CROSS-REFERENCE TO RELATED APPLICATIONS

This application is a U.S. National Stage Application under 35 U.S.C. § 371 of International Patent Application No. PCT/IB2018/058792, filed Nov. 8, 2018, the contents of which are each hereby incorporated by reference in their respective entireties.

TECHNICAL FIELD

The present disclosure relates to a method and compact device for measurement of a single ultrashort laser pulse or an average of multiple pulses without any moving parts. This technique will be referred to as parallel d-scan.

BACKGROUND

The characterization of ultrashort laser pulses is often as important as the generation process itself. Since no optical and optoelectronic methods exist for the direct measurement of such short events, self-referencing optical techniques are usually employed.

Traditionally, ultrashort pulses have been characterized by nonlinear autocorrelation diagnostics [13] which are still widely used in many laboratories. Although relatively simple to implement, these fail to provide complete information (i.e. amplitude and phase) about the pulses, providing only an estimate of the actual pulse duration. Still, several methods have been devised allowing for the reconstruction of the amplitude and phase of the pulses by combination of autocorrelation and spectral measurements (see, e.g. [14-16]).

An important improvement over these techniques came in 1993 with the introduction of frequency resolved optical gating (FROG) [1,3]: by spectrally resolving an autocorrelation (or cross-correlation) signal, a sonogram-like trace is created from which complete characterization of a given pulse can be performed using an iterative algorithm. The quality of the retrieval is reflected by the corresponding FROG error, and the time and frequency marginals of the trace also provide a means to cross-check the results. There are many variants of FROG today, which all rely on spectrally resolving some time-gated nonlinear signal.

Other methods widely used today are related to the technique of spectral phase interferometry for direct electric-field reconstruction (SPIDER), first introduced in 1998 [2]. These methods do not rely on temporal gating, but instead on interferometry in the spectral domain: the spectrum of a given pulse is made to interfere with a frequency-shifted (sheared) replica of itself, and the resulting spectral interferogram is recorded. Although usually more complicated to set up, retrieving the spectral phase from a SPIDER trace is numerically much simpler than in FROG. Standard SPIDER however is very sensitive to alignment and this can easily affect the measured pulse, as there is no straightforward means to determine the quality of the phase measurement. However, new SPIDER-related methods have been devised that allow overcoming this issue [5-7].

More recently, a pulse characterization method based on phase scanning, known as multiphoton intrapulse interference phase scan (MIIPS) [17-19], was introduced. It consists in applying purely quadratic phases to the pulse to be characterized and measuring the resulting second-harmonic generation (SHG) signal. By finding which locally introduced amount of group delay dispersion (GDD) results in compression at a given wavelength, an approximation to the GDD of the pulse can be found, thereby allowing for the reconstruction of an approximation of the unknown phase. If a pulse shaper is available in the setup, this phase approximation can now be applied to the shaper and the whole procedure is repeated. This process takes several iterations of measurements as the phase in each measurement step is approximately calculated. Also, a MIIPS measurement requires scanning the spectral phase applied to the pulses, which precludes parallel acquisition and operation.

A more recent method is Self-Referenced Spectral Interferometry (SRSI) [20,21], where a reference pulse with a flat spectral phase is collinearly generated from the input pulse by cross-polarized wave generation (XPW) in a nonlinear crystal. The spectral interference pattern resulting from the combination of the input pulse and the reference pulse allows direct retrieval of the spectral phase and intensity. This method however can only measure pulses with durations very close to the Fourier limit, and is limited to time-bandwidth products of the order of 2. Therefore, SRSI has a very limited tolerance to the input pulse chirp and a small measuring range compared to most other techniques. Furthermore, it can only measure amplified laser pulses, since XPW is a third-order nonlinear process that requires several microjoules of energy per pulse in order to work.

A related method to the method disclosed here and introduced very recent is called dispersion-scan (d-scan) [8, 9, 12, 22, 23], which consists in applying well-known or parametrized spectral phases to the pulse to be characterized around the optimal compression point and, for each applied spectral phase, measuring the spectrum of a nonlinear signal, such as sum-frequency generation (SFG) and second-harmonic generation (SHG), produced by the pulse in a nonlinear medium. By coupling this measurement with a suitable mathematical model and processing algorithm, one is able to fully retrieve the spectral phase of the pulse to be measured from a single d-scan measurement, without the need of approximations (unlike in MIIPS). This method is highly robust to noise and can even correctly retrieve the phase when there is no SHG signal for a given frequency, as long as there is SFG signal generated by mixing that frequency with other parts of the spectrum. Additionally, a dispersion-scan setup doubles as a pulse compressor, which together with its measurement capability allows one to optimize the compression of the pulse.

In standard d-scan, the characterization of laser pulses is done in scanning mode, and it is not possible to measure a single pulse. The need for parallel acquisition and operation is present in laser systems with low repetition rates, or even in laser systems with high repetition rates, where subsequent pulses might be different from each other and require tagging by a parallel acquisition and characterization technique. A parallel acquisition technique will by definition be faster than a scanning approach. The option of parallel acquisition measurement is helpful for alignment and optimization of the laser system and to identify possible optimization parameters that would be very hard or impossible to observe with a scanning procedure. Therefore, a measurement technique and compact apparatus that allows parallel acquisition and operation of the d-scan technique should have great impact in the laser manufacturing community as well as in industrial and medical applications, for fast real-time diagnostic and optimization of the laser sources.

These facts are disclosed in order to illustrate the technical problem addressed by the present disclosure.

GENERAL DESCRIPTION

The wide use of ultrashort pulses, e.g., in attosecond science and high field physics, calls for accurate optical characterization of complex coherent light pulses with durations down to the single-cycle. However, this characterization remains challenging.

The present disclosure relates to laser systems and laser pulse measurement methods. An embodiment of the method comprises a dispersive system for applying a controlled chirp, negative or positive, to an incoming ultrashort light pulse to be measured; an optical system for selecting an homogeneous part of the transverse spatial beam profile of said light pulse; applying different spectral phases to different spatial parts of the beam obtained in the previous step, which comprises allowing different spatial parts of the beam to cross different thicknesses of material; focusing or propagating the beam in a nonlinear medium after applying the spectral phases; applying a nonlinear process to the pulse to be characterized for each spatial part of the beam, allowing the generation of a nonlinear signal for each spatial part of the beam; measuring the corresponding bi-dimensional data set that has the information on the nonlinear signal generated for each applied spectral phase in a detector; applying a numerical iterative algorithm to the measured data set to retrieve the spectral phase of the pulse to be characterized; such process being done in a parallel fashion.

The solution comprises in propagating or focusing the laser beam in the nonlinear medium in such a way that different amounts of spectral phase are imparted to each spatial part of the laser beam all at once, with each said part then simultaneously undergoing a nonlinear optical process, in parallel and without the need of scanning the element that introduces the spectral phases.

Several characterization techniques have been developed throughout the years, such as frequency resolved optical gating (FROG) [1], spectral phase interferometry for direct electric field reconstruction (SPIDER) [2], and their multiple variations (see, e.g., [3-7]). Later, a new method requiring no major manipulation of the pulses was introduced: the dispersion-scan technique (d-scan) [8,9]. The d-scan allows for simultaneous measurement and compression of pulses with compressed durations from sub-3-fs up to hundreds of femtoseconds. It is compact, simple to implement and gives a robust and precise pulse retrieval. Although variants of FROG have been developed several years ago [10], with few-cycle-capable implementations also devised [11], and SPIDER [2] (although SPIDER implementations suitable for complex pulses require complex experimental setups [5-7]), it was only recently that a version of the d-scan without any moving parts, and capable of measuring one pulse, was proposed [12], but the required geometry makes it impossible in practice to make this configuration compact and portable to have an apparatus that can be used with different laser systems in a laboratory.

The present subject-matter describes a compact design for pulse temporal measurement which allows measuring one single pulse or an average of multiple pulses, based on parallel acquisition of the dispersion-scan trace, for real time visualization of ultrashort light pulses, including very short pulses, typically from sub-3-fs to 20 fs. This compact architecture provides a robust measurement with an outstanding signal-to-noise ratio. This compact, easy to implement and reliable pulse measurement device may prove itself very useful for everyday use, while working for example with hollow-capillary laser post-compression, allowing video rate display of the measurement while operating and optimizing the laser system. The proposed apparatus allows one to fully retrieve the unknown spectral phase of the pulse using numerical iterative algorithms that take advantage of the whole dataset in the spectral domain, making the method very robust with respect to noise sensitivity and bandwidth requirements.

An aspect of the present disclosure relates to a method for ultrashort pulse measurement comprising the following steps: introducing a controlled chirp, negative or positive, to an incoming ultrashort light pulse to be measured; selecting a substantially homogeneous portion of the transverse spatial beam profile of said light pulse; propagating the beam resulting from the previous step through optical elements that allow imparting different spectral phases to different spatial components of said beam; applying a nonlinear optical process to the beam resulting from the previous step for each different spatial component of said beam; recording, by an analyzing means, a bi-dimensional set of data comprising the spectrum of the nonlinear signal generated for each different spatial component of said beam; and executing, by a processing module comprising one or more processors, a numerical iterative algorithm to said recorded spectral image, to retrieve the amplitude and phase of the electric field of the ultrashort light pulse.

In an embodiment, after imparting different spectral phases to different spatial components of said beam, the different spatial components of said beam are projected along a line before applying a nonlinear optical process for each different spatial component of said beam.

In an embodiment, the applied nonlinear process comprises second-harmonic generation or any other nonlinear effect that affects the fundamental spectrum of the ultrashort light pulse, comprising sum-frequency generation, difference-frequency generation, the optical Kerr effect, self- and cross-phase modulation, cross-polarized wave generation, third- and higher-order harmonic generation, or combinations thereof.

In an embodiment, the method my further comprise means to execute in parallel said impartment of spectral phases, nonlinear optical process and recording of the resulting nonlinear signal generated for each different spatial component of said beam.

Another aspect of the present disclosure relates to a device for ultrashort pulse measurement, comprising:
  a section for applying a controlled chirp, negative or positive, to an incoming ultrashort light pulse to be measured;
  a section for selecting a homogeneous portion of the transverse spatial beam profile of said light pulse;
  a section to propagate the beam resulting from the previous step through optical elements that allow imparting different spectral phases to different spatial components of said beam;
  a section for applying a nonlinear process to the beam resulting from the previous step for each different spatial component of said beam;
  a sensor for recording, by an analyzing means, the bi-dimensional set of data comprising the spectrum of the nonlinear signal generated for different spatial component of said beam; and
  a processing module comprising one or more processors configured for executing a numerical iterative algorithm, to said recorded spectral image, to retrieve the amplitude and phase of the electric field of the ultrashort light pulse.

In an embodiment, the section for projecting the different spatial components of said beam into a line is inserted after the section for imparting different spectral phases to different spatial components of said beam and before the section for applying a nonlinear optical process for each different spatial component of said beam.

In an embodiment, the section for projecting the different spatial components of said beam into a line comprises spherical mirrors, parabolic mirrors, spherical lenses, aspherical lenses, prisms, wedges, windows, plates, cylindrical lenses, or combinations thereof.

In an embodiment, the section for applying a controlled chirp comprises a pulse compressor or a pulse stretcher.

In an embodiment, the pulse compressor or stretcher comprises chirped mirrors and glass wedges.

In an embodiment, the section for selecting a homogeneous portion of the transverse spatial beam profile of said light pulse comprises focusing mirrors, lenses, prisms, wedges, windows, plates, or combinations thereof.

In an embodiment, the section that allows imparting different spectral phases to different spatial components of the beam comprises materials in different thicknesses, wedges, prisms, grisms, diffraction gratings, and/or optical modulators such as acousto-optic, electro-optic and/or liquid crystal based devices, or combinations thereof.

In an embodiment, the applied nonlinear process comprises second-harmonic generation or any other nonlinear effect that affects the fundamental spectrum of the ultrashort light pulse, comprising sum-frequency generation, difference-frequency generation, the optical Kerr effect, self- and cross-phase modulation, cross-polarized wave generation, third- and higher-order harmonic generation, or combinations thereof, taking place in gases, solids, liquids or plasmas.

In an embodiment, the numerical iterative algorithm comprises a Multiphoton Intrapulse Interference Phase Scan, or MIIPS, algorithm, a Chirp Reversal Technique, or CRT, algorithm, a dispersion-scan, or d-scan, algorithm, or a combination thereof.

In an embodiment, the method may comprise means to execute in parallel said impartment of spectral phases, nonlinear conversion and measurement of the resulting signal.

In an embodiment, the incoming ultrashort light pulse to be measured does not have to pass through maximum compression to perform the measurement.

BRIEF DESCRIPTION OF THE DRAWINGS

The following figures provide preferred embodiments for illustrating the disclosure and should not be seen as limiting the scope of invention.

DETAILED DESCRIPTION

Figure 1:
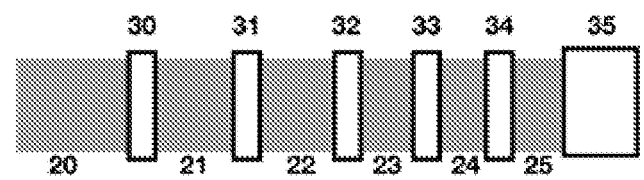
FIG. 1: Simplified diagram of the parallel d-scan measurement technique and apparatus. The laser system under measurement is a chirped pulse amplification Ti:Sapphire laser, delivering 20 fs pulses at 1 kHz repetition rate with a pulse energy of up to 5 mJ, which has been post-compressed to few-cycle durations (20) using a hollow capillary differentially pumped with helium in combination with a wedge pair and chirped mirror (30) setup.

The principle of the d-scan technique is based on measuring spectrum of a nonlinear signal as a function of dispersion around the point of optimal compression of the pulse. A nonlinear conversion process, such as second-harmonic generation (SHG), is strongly dependent on the spectral phase of the pulse, so by processing its spectral intensity as a function of dispersion, one can retrieve the spectral phase of the pulse and reconstruct its temporal profile.

In the standard d-scan [8,9], the dispersion is scanned by moving a glass wedge into the beam step by step, and for each step, the second-harmonic spectrum is recorded with a 1D spectrometer. Therefore, a two-dimensional trace showing the second-harmonic spectrum as a function of dispersion is obtained. In order to perform a parallel d-scan measurement, this two-dimensional trace needs to be acquired without using any moving parts, which ultimately enables measuring one single pulse. Unlike the d-scan technique, the parallel d-scan technique does not require the dispersion to cross the point of maximum pulse compression to perform the measurement. One of the main ideas is to have a homogeneous beam and let every part of the beam along, for example, the horizontal axis undergo a different amount of dispersive material, e.g. by having the beam go through a wedge or through an optical component with a spatially varying thickness or a spatially variable refractive index, and then observe the spectrum of the second-harmonic, or of other nonlinear process, obtained as a function of the horizontal position using an imaging spectrometer.

In a previous implementation of d-scan [12], this was performed using a 400 μm slit placed before a prism. The output plane of the prism was reimaged onto a second-harmonic crystal which was then reimaged onto the entrance slit of an imaging spectrometer.

In an embodiment, a straightforward way to increase the sensitivity of the measurement is to remove the slit and use the whole beam, and focus it in one direction, i.e., each line of the beam that underwent the same glass dispersion gets focused into a point. This can be done for example using cylindrical mirrors, an array of optical lenses or an array of spherical mirrors. In the present invention, we use an even simpler and more compact apparatus. By using a tilted spherical mirror, it is possible to focus in one plane while projecting on the other, with only one standard optical component. The device is made even more compact by skipping the step of imaging from the crystal to the entrance slit of the imaging spectrometer.

In an embodiment, in order to minimize aberrations and to provide an apparatus as compact as possible, an astigmatism-free crossed Czerny-Turner imaging spectrometer design [25-27] was chosen to measure the two-dimensional d-scan trace. Other types of imaging spectrometer could have been chosen.

In an embodiment, the chosen imaging spectrometer was aligned, characterized and spectrally calibrated using a UV lamp and a row of holes as the entrance slit. A spectral resolution of $\Delta\lambda$=1.6 nm was experimentally obtained over the full spectral range from 273 nm to 459 nm.

In an embodiment, to perform the parallel d-scan measurement, the entrance slit of the Czerny-Turner imaging spectrometer was replaced by a nonlinear crystal. In the imaging spectrometer, a camera allowing a spectral detection range from 200 nm to 1100 nm was used as detector. Either CCD or CMOS technology can be used in this implementation.

In an embodiment, the experimental setup used a chirped pulse amplification Ti:Sapphire laser, delivering 20 fs pulses at 1 kHz repetition rate with a pulse energy of up to 5 mJ. A hollow capillary, differentially pumped with helium, in combination with a pair of motorized fused silica wedges and a chirped mirror set was used to post-compress the pulses to few-cycle durations [20] and energies of around 600 µJ.

In an embodiment, the fundamental spectrum of the pulse can either be retrieved from the measured d-scan trace or measured directly. The latter can be done: i) with a flip mirror to direct the beam either to a 1D spectrometer or to the parallel d-scan pulse measurement apparatus; or ii) using a beam sampler, such as a beamsplitter or a partial reflection from an optical element, to measure the fundamental spectrum in parallel with the single-shot measurement.

In an embodiment, a simplified diagram of the parallel d-scan pulse measurement apparatus is given in FIG. 1. The source of ultrashort pulses to be measured is the already mentioned post-compressor (20), which includes a pair of motorized fused silica wedges for fine-tuning the dispersion and a set of chirped mirrors (30) to impart negative dispersion to the pulse. The pulse is then sent through a beam selection section (31) with a magnification factor that allows selecting the homogeneous central part of the beam for the measurement. The beam goes through an optical wedge (32) where different parts of the magnified section of the beam along the horizontal axis will experience different applied spectral phases. The output plane of the wedge is then projected and focused with a tilted spherical mirror (33) into a horizontal line on a nonlinear optical material (34), in this case a BBO crystal. This BBO crystal serves as the entrance slit of a Czerny-Turner astigmatism-free imaging spectrometer (35) which records the spatially- and hence dispersion-dependent second-harmonic spectrum of the pulse.

Figure 2:
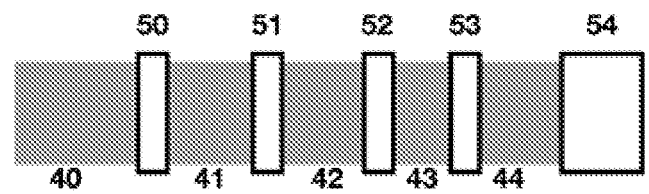
FIG. 2: Simplified diagram of other implementation of the parallel d-scan measurement technique and apparatus. The laser system under measurement is a chirped pulse amplification Ti:Sapphire laser, delivering 20 fs pulses at 1 kHz repetition rate with a pulse energy of up to 5 mJ, which has been post-compressed to few-cycle durations (40) using a hollow capillary differentially pumped with helium in combination with a wedge pair and chirped mirror (50) setup.

In an embodiment, another implementation of the parallel d-scan apparatus is shown in FIG. 2. The source of ultrashort pulses to be measured is the already mentioned post-compressor (40), which includes a pair of motorized fused silica wedges for fine-tuning the dispersion and a set of chirped mirrors (50) to impart negative dispersion to the pulse. The pulse is then sent through a beam selection section (51) that allows selecting the homogeneous central part of the beam for the measurement. The beam goes through an optical wedge (52) where different parts of the magnified section of the beam along the horizontal axis will experience different applied spectral phases. The beam along the horizontal axis with different applied spectral phases propagates through a nonlinear optical medium (53), for example a second harmonic generation crystal, generating a nonlinear signal. This nonlinear crystal serves as the entrance slit of a Czerny-Turner astigmatism-free imaging spectrometer (54) which records the spatially- and hence dispersion-dependent second-harmonic spectrum of the pulse.

Figure 3:
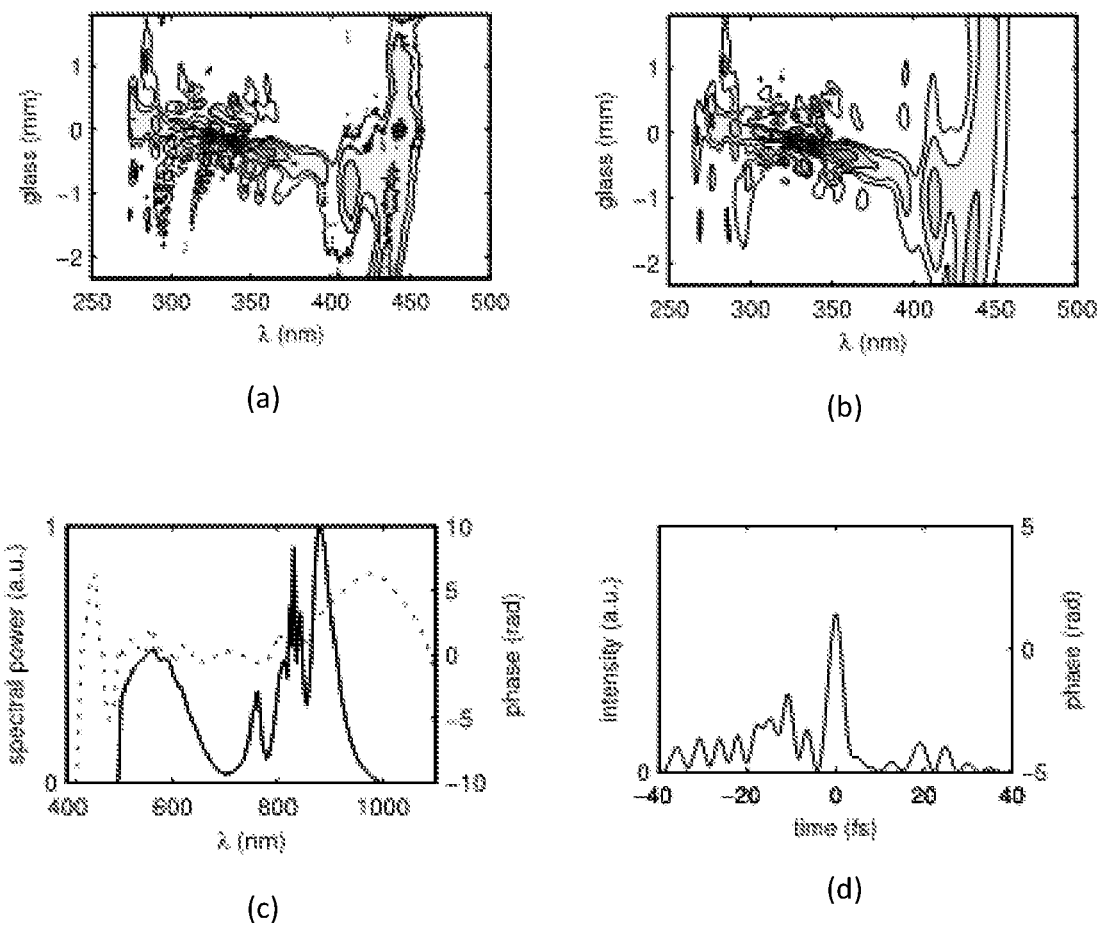
FIG. 3: Parallel d-scan characterization of the output from a hollow capillary pulse compressor: (a) Measured and (b) retrieved d-scan traces. (c) Measured spectrum (black) and retrieved spectral phase (dotted line). (d) Retrieved temporal profile of the compressed 4.0 fs (FWHM) pulses.

In an embodiment, FIG. 3 shows the measurements done with the parallel d-scan apparatus. The integration time was 25 ms, so the measurement is averaged over 24 pulses. The measured and the retrieved traces show a very good visual agreement. The measured pulse duration is 4.0 fs FWHM, and the retrieval has an rms error of 0.015, which denotes the achieved very good agreement between measurement and retrieval. These results are also in excellent agreement with standard (scanning) d-scan measurements of the same source, as well as with non-averaged single-shot measurements of a single pulse.

For the shown implementation, the alignment is very easy (no interferometric precision or stability are needed). Also, we are not as limited by the phase-matching restrictions of the SHG crystal as with other techniques, which allows for the characterization of extremely broad bandwidth pulses without having to sacrifice SHG efficiency by employing unpractically thin crystals. As a result, we were able to obtain a simple, efficient and robust device capable of successfully measuring ultrashort light pulses from the few-cycle regime to <20 fs in single-shot operation.

This new pulse measuring technique and device should be important to anyone using femtosecond laser pulses, both in scientific research and in real-world uses, from medical to industrial applications.

The terms "comprises" and "comprising", whenever used in this document, are intended to indicate the presence of stated features, integers, steps, components, but not to preclude the presence or addition of one or more other features, integers, steps, components or groups thereof.

Flow or optical diagrams of particular embodiments of the presently disclosed methods are depicted in figures. The diagrams illustrate the functional information one of ordinary skill in the art requires to perform said methods required in accordance with the present disclosure.

It will be appreciated by those of ordinary skill in the art that unless otherwise indicated herein, the particular sequence of steps described is illustrative only and can be varied without departing from the disclosure. Thus, unless otherwise stated, the steps described are so unordered meaning that, when possible, the steps can be performed in any convenient or desirable order such that the same result is achieved.

The disclosure should not be seen in any way restricted to the embodiments described and a person with ordinary skill in the art will foresee many possibilities to modifications thereof. The above described embodiments are combinable. The following claims further set out particular embodiments of the disclosure.

The following references should be considered herewith incorporated in their entirety.

1. D. J. Kane and R. Trebino, "Characterization of Arbitrary Femtosecond Pulses Using Frequency-Resolved Optical Gating," IEEE J. Quantum Electron. 29, 571 (1993).
2. C. Iaconic and I. A. Walmsley, "Spectral phase interferometry for direct electric field reconstruction of ultrashort optical pulses," Opt. Lett. 23, 792 (1998).
3. R. Trebino and D. J. Kane, "Using phase retrieval to measure the intensity and phase of ultrashort pulses: frequency-resolved optical gating," J. Opt. Soc. Am. A 10, 1101 (1993).
4. R. Trebino, K. W. DeLong, D. N. Fittinghoff, J. Sweetser, M. A. Krum-bügel, and B. Richman, "Measuring ultrashort laser pulses in the time-frequency domain using frequency-resolved optical gating," Rev. Sci. Instrum. 68, 1 (1997).
5. S. Wyatt, I. A. Walmsley, G. Stibenz, and G. Steinmeyer, "Sub-10 fs pulse characterization using spatially encoded arrangement for spectral phase interferometry for direct electric field reconstruction," Opt. Lett. 31, 1914-1916 (2006).
6. T. Witting, F. Frank, W. Okell, C. Arrell, J. Marangos, and J. Tisch, "Sub-4-fs laser pulse characterization by spatially resolved spectral shearing interferometry and attosecond streaking," Journal of Physics B: Atomic, Molecular and Optical Physics 45, 074014 (2012).
7. J. R. Birge, H. M. Crespo, and F. X. Kartner, "Theory and design of two-dimensional spectral shearing interferometry for few-cycle pulse measurement," J. Opt. Soc. Am. B 27, 1165-1173 (2010).
8. M. Miranda, T. Fordell, C. Arnold, A. L'Huillier, and H. Crespo, "Simultaneous compression and characterization of ultrashort laser pulses using chirped mirrors and glass wedges," Opt. Express 20, 688-697 (2012).
9. M. Miranda, C. L. Arnold, T. Fordell, F. Silva, B. Alonso, R. Weigand, A. L'Huillier, and H. Crespo, "Characterization of broadband few-cycle laser pulses with the d-scan technique," Opt. Express 20, 18732-18743 (2012).
10. Daniel J. Kane and Rick Trebino, "Single-shot measurement of the intensity and phase of an arbitrary ultrashort pulse by using frequency-resolved optical gating," Opt. Lett. 18, 823-825 (1993).
11. Selcuk Akturk, Ciro D'Amico, and Andre Mysyrowicz, "Measuring ultrashort pulses in the single-cycle regime using frequency-resolved optical gating," J. Opt. Soc. Am. B 25, A63-A69 (2008).
12. D. Fabris, W. Holgado, F. Silva, T. Witting, J. W. G. Tisch, and H. Crespo, "Single-shot implementation of dispersion-scan for the characterization of ultrashort laser pulses," Opt. Express 23, 32803-32808 (2015).
13. J. A. Armstrong, "Measurement of picosecond laser pulse widths", Appl. Phys. Lett. 10 (1), 16 (1967).
14. K. Naganuma, K. Mogi and H. Yamada, "General method for ultrashort light pulse chirp measurement," in IEEE Journal of Quantum Electronics 25, 1225-1233 (1989). doi: 10.1109/3.29252
15. Baltuska, Z. Wei, M. S. Pshenichnikov, D. A. Wiersma, and R. Szipocs, "All-solid-state cavity-dumped sub-5-fs laser," Appl. Phys. B 65, 175-188 (1997).
16. J. W. Nicholson, J. Jasapara, W. Rudolph, F. G. Omenetto, and A. J. Taylor, "Full-field characterization of femtosecond pulses by spectrum and cross-correlation measurements," Opt. Lett. 24, 1774-1776 (1999).
17. V. V. Lozovoy, I. Pastirk, and M. Dantus, "Multiphoton intrapulse interference. IV. Ultrashort laser pulse spectral phase characterization and compensation," Opt. Lett. 29, 775-777 (2004).
18. B. Xu, J. M. Gunn, J. M. D. Cruz, V. V. Lozovoy, and M. Dantus, "Quantitative investigation of the multiphoton intrapulse interference phase scan method for simultaneous phase measurement and compensation of femtosecond laser pulses," J. Opt. Soc. Am. B 23, 750-759 (2006).
19. Y. Coello, V. V. Lozovoy, T. C. Gunaratne, B. Xu, I. Borukhovich, C.-H. Tseng, T. Weinacht, and M. Dantus, "Interference without an interferometer: a different approach to measuring, compressing, and shaping ultrashort laser pulses," J. Opt. Soc. Am. B 25, A140-A150 (2008).
20. T. Oksenhendler, S. Coudreau, N. Forget, V. Crozatier, S. Grabielle, R. Herzog, O. Gobert, and D. Kaplan, Appl. Phys. B 99, 7 (2010).
21. Trabattoni, T. Oksenhendler, H. Jousselin, G. Tempea, S. D. Silvestri, G. Sansone, F. Calegari, and M. Nisoli, Rev. Sci. Instrum. 86, 113106 (2015).
22. Patent application WO-A1-2013/054292
23. F. Silva, M. Miranda, B. Alonso, J. Rauschenberger, V. Pervak, and H. Crespo, "Simultaneous compression, characterization and phase stabilization of GW-level 1.4 cycle VIS-NIR femtosecond pulses using a single dispersion-scan setup," Opt. Express 22, 10181-10191 (2014).
24. H. Kogelnik, E. Ippen, A. Dienes and C. Shank, "Astigmatically compensated cavities for CW dye lasers," IEEE J. Quantum Electron. 8, 373-379 (1972). doi: 10.1109/JQE.1972.1076964
25. B. Bates, M. McDowell, and A. C. Newton, "Correction of astigmatism in a Czerny-Turner spectrograph using a plane grating in divergent illumination," J. Ph. E 3, 206 (1970).
26. D. R. Austin, T. Witting, and I. A. Walmsley, "Broadband astigmatism-free Czerny-Turner imaging spectrometer using spherical mirrors," Appl. Opt. 48, 3846-3853 (2009).
27. Y. An, Q. Sun, Y. Liu, C. Li, and Z.-Q. Wang, "The design of astigmatism-free crossed Czerny-Turner spectrometer," Optik 124, 2539-2543 (2013).
28. M. Louisy, C. L. Arnold, M. Miranda, E. W. Larsen, S. N. Bengtsson, D. Kroon, M. Kotur, D. Guénot, L. Rading, P. Rudawski, F. Brizuela, F. Campi, B. Kim, A. Jarnac, A. Houard, J. Mauritsson, P. Johnsson, A. L'Huillier, and C. M. Heyl, "Gating attosecond pulses in a noncollinear geometry," Optica 2, 563-566 (2015).
29. M. Miranda, J. Penedones, C. Guo, A. Harth, M. Louisy, L. Neoricic, A. L'Huillier, and C. L. Arnold, "Fast iterative retrieval algorithm for ultrashort pulse characterization using dispersion scans," J. Opt. Soc. Am. B 34, 190-197 (2017).

The invention claimed is:

1. A method for ultrashort pulse measurement comprising the following steps:
   introducing a controlled chirp, negative or positive, to an incoming ultrashort light pulse to be measured;
   selecting a homogeneous portion of the transverse spatial beam profile of said light pulse;
   propagating the beam resulting from the previous step through an arrangement of optical elements for imparting different spectral phases to different spatial components of said beam;
   applying a nonlinear optical process to the beam resulting from the previous step for each different spatial component of said beam;
   recording a bi-dimensional set of data comprising the spectrum of the nonlinear signal generated for each different spatial component of said beam; and
   calculating, by an electronic data processor, a numerical iterative algorithm to said recorded spectral image data, to retrieve the amplitude and phase of the electric field of the ultrashort light pulse.

2. The method according to claim 1, further comprising, after imparting different spectral phases to different spatial components of said beam, projecting the different spatial components of said beam along a line before applying a nonlinear optical process for each different spatial component of said beam.

3. The method according to claim 1, wherein the applied nonlinear process comprises second-harmonic generation or another nonlinear effect that affects the fundamental spectrum of the ultrashort light pulse selected from the group consisting of: sum-frequency generation, difference-frequency generation, the optical Kerr effect, self- and cross-phase modulation, cross-polarized wave generation, third- and higher-order harmonic generation, and combinations thereof.

4. The method according to claim 1, comprising the use of means to execute in parallel said impartment of spectral phases, nonlinear optical process and recording of the resulting nonlinear signal generated for each different spatial component of said beam.

5. A device for ultrashort pulse measurement, comprising:
- an optical section for applying a controlled chirp, negative or positive, to an incoming ultrashort light pulse to be measured;
- an optical section for selecting a homogeneous, central portion of the transverse spatial beam profile of said light pulse from the previous section;
- an optical section to propagate the beam from the previous section through optical elements for imparting different spectral phases to different spatial components of said beam;
- an optical section for applying a nonlinear process to the beam resulting from the previous section for each different spatial component of said beam;
- a sensor for recording the bi-dimensional set of data comprising the spectrum of the nonlinear signal generated for different spatial component of said beam from the previous section; and
- an electronic data processor configured for executing a numerical iterative algorithm, to said recorded spectral image recorded by said sensor, to retrieve the amplitude and phase of the electric field of the ultrashort light pulse.

6. The device according to claim 5, wherein a section for projecting the different spatial components of said beam into a line is inserted after the optical section for imparting different spectral phases to different spatial components of said beam and before the section for applying a nonlinear optical process for each different spatial component of said beam.

7. The device according to claim 6, wherein the optical section for projecting the different spatial components of said beam into a line comprises spherical minors, parabolic mirrors, spherical lenses, aspherical lenses, prisms, wedges, windows, plates, cylindrical lenses, or combinations thereof.

8. The device according claim 5, wherein the optical section for applying a controlled chirp comprises a pulse compressor or a pulse stretcher.

9. The device according to claim 8, wherein said pulse compressor or stretcher comprises chirped minors and glass wedges.

10. The device according to claim 5, wherein the optical section for selecting a homogeneous portion of the transverse spatial beam profile of said light pulse comprises focusing mirrors, lenses, prisms, wedges, windows, plates, or combinations thereof.

11. The device according to claim 5, wherein the optical section that allows imparting different spectral phases to different spatial components of the beam comprises materials in different thicknesses, wedges, prisms, grisms, diffraction gratings, and/or optical modulators such as acousto-optic, electro-optic and/or liquid crystal based devices, or combinations thereof.

12. The device according to claim 5, wherein the applied nonlinear process comprises second-harmonic generation or any other nonlinear effect that affects the fundamental spectrum of the ultrashort light pulse, comprising sum-frequency generation, difference-frequency generation, the optical Kerr effect, self- and cross-phase modulation, cross-polarized wave generation, third- and higher-order harmonic generation, or combinations thereof, taking place in gases, solids, liquids or plasmas.

13. The device according to claim 5, wherein the numerical iterative algorithm comprises a Multiphoton Intrapulse Interference Phase Scan, MIIPS algorithm, a Chirp Reversal Technique, CRT algorithm, a dispersion-scan, a d-scan algorithm, or a combination thereof.

14. The device according to claim 5, comprising means to execute in parallel said impartment of spectral phases, nonlinear conversion and measurement of the resulting signal.

15. The device according to claim 5, wherein the incoming ultrashort light pulse to be measured does not have to pass through maximum compression to perform the measurement.

* * * * *